(12) United States Patent
Kim

(10) Patent No.: US 12,057,377 B2
(45) Date of Patent: Aug. 6, 2024

(54) MULTICHIP PACKAGED SEMICONDUCTOR DEVICE

(71) Applicant: Magnachip Semiconductor, Ltd., Cheongju-si (KR)

(72) Inventor: Hyun Dong Kim, Goyang-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 34 days.

(21) Appl. No.: 17/838,949

(22) Filed: Jun. 13, 2022

(65) Prior Publication Data
US 2022/0310495 A1    Sep. 29, 2022

Related U.S. Application Data

(62) Division of application No. 13/875,676, filed on May 2, 2013, now Pat. No. 11,362,022.

(30) Foreign Application Priority Data

Dec. 6, 2012   (KR) ........................ 10-2012-0141266

(51) Int. Cl.
*H01L 23/495* (2006.01)
*H01L 21/56* (2006.01)
*H01L 23/00* (2006.01)

(52) U.S. Cl.
CPC ........ *H01L 23/49537* (2013.01); *H01L 21/56* (2013.01); *H01L 21/565* (2013.01); *H01L 23/49541* (2013.01); *H01L 23/49551* (2013.01); *H01L 23/49555* (2013.01); *H01L 23/49562* (2013.01); *H01L 23/49575* (2013.01); *H01L 24/32* (2013.01); *H01L 24/48* (2013.01);

(Continued)

(58) Field of Classification Search
CPC . H01L 2224/32245; H01L 2224/48175; H01L 2224/92247; H01L 23/12; H01L 23/495; H01L 23/49537
USPC ....................................................... 257/676
See application file for complete search history.

(56) References Cited

U.S. PATENT DOCUMENTS 4,791,472 A   12/1988   Okikawa et al.
4,801,997 A   1/1989    Ono et al.
(Continued)

FOREIGN PATENT DOCUMENTS

CN   1098822 A   2/1995
CN   1123469 A   5/1996
(Continued)

OTHER PUBLICATIONS

Chinese Office Action issued on Jul. 4, 2017 in corresponding Chinese Patent Application No. 201310194087.6 (12 pages in Chinese).

(Continued)

*Primary Examiner* — Caleb E Henry
*Assistant Examiner* — Dilinh P Nguyen
(74) *Attorney, Agent, or Firm* — NSIP Law

(57) ABSTRACT

A multichip package and a method for manufacturing the same are provided. A multichip package includes: a plurality of semiconductor chips each mounted on corresponding lead frame pads; lead frames connected to the semiconductor chips by a bonding wire; and fixed frames integrally formed with at least one of the lead frame pads and configured to support the lead frame pads on a package-forming substrate.

10 Claims, 3 Drawing Sheets

(52) U.S. Cl.
CPC .............. H01L 24/73 (2013.01); H01L 24/83 (2013.01); H01L 24/92 (2013.01); H01L 24/29 (2013.01); H01L 24/45 (2013.01); H01L 2224/2929 (2013.01); H01L 2224/29339 (2013.01); H01L 2224/32245 (2013.01); H01L 2224/45147 (2013.01); H01L 2224/45565 (2013.01); H01L 2224/45616 (2013.01); H01L 2224/48091 (2013.01); H01L 2224/48137 (2013.01); H01L 2224/48175 (2013.01); H01L 2224/48247 (2013.01); H01L 2224/73265 (2013.01); H01L 2224/83851 (2013.01); H01L 2224/92247 (2013.01); H01L 2924/00011 (2013.01); H01L 2924/0665 (2013.01); H01L 2924/13091 (2013.01); H01L 2924/181 (2013.01)

(56) References Cited

U.S. PATENT DOCUMENTS

| | | | |
|---|---|---|---|
| 5,336,927 | A | 8/1994 | Suetake |
| 5,393,991 | A | 2/1995 | Kawakami |
| 5,623,162 | A | 4/1997 | Kurihara |
| 5,874,773 | A | 2/1999 | Terada et al. |
| 5,939,781 | A | 8/1999 | Lacap |
| 6,166,446 | A | 12/2000 | Masaki |
| 6,429,047 | B1 | 8/2002 | Huang |
| 7,508,055 | B2 | 3/2009 | Katou et al. |
| 7,554,209 | B2 | 6/2009 | Satou et al. |
| 7,683,464 | B2 | 3/2010 | Sun et al. |
| 8,003,447 | B2 * | 8/2011 | Lee ................. H01M 10/44 257/796 |
| 8,053,874 | B2 | 11/2011 | Sun et al. |
| 8,076,767 | B2 | 12/2011 | Uno et al. |
| 8,188,582 | B2 | 5/2012 | Seo |
| 2002/0192464 | A1 | 12/2002 | Yamazaki et al. |
| 2003/0011054 | A1 | 1/2003 | Jeun et al. |
| 2003/0020148 | A1 | 1/2003 | Kiyohara |
| 2005/0054141 | A1 | 3/2005 | Kim et al. |
| 2005/0145996 | A1 | 7/2005 | Luo et al. |
| 2005/0231990 | A1 | 10/2005 | Uno et al. |
| 2007/0290364 | A1 | 12/2007 | Gupta et al. |
| 2009/0014853 | A1 | 1/2009 | Luo et al. |
| 2009/0115038 | A1 | 5/2009 | Son et al. |
| 2009/0128968 | A1 | 5/2009 | Lu et al. |
| 2009/0215230 | A1 | 8/2009 | Muto et al. |
| 2009/0224377 | A1 | 9/2009 | Fan et al. |
| 2009/0243078 | A1 | 10/2009 | Lim et al. |
| 2010/0091472 | A1 | 4/2010 | Kummerl et al. |
| 2011/0089546 | A1 | 4/2011 | Bayan |
| 2011/0115063 | A1 | 5/2011 | Sharma et al. |
| 2012/0025227 | A1 | 2/2012 | Chan et al. |
| 2012/0126384 | A1 * | 5/2012 | Meng ................. H01L 23/49503 257/670 |
| 2012/0164794 | A1 | 6/2012 | Xue et al. |
| 2012/0175756 | A1 | 7/2012 | Kim et al. |
| 2012/0248539 | A1 | 10/2012 | Zhang et al. |
| 2012/0292778 | A1 | 11/2012 | Liu et al. |
| 2013/0020687 | A1 * | 1/2013 | Kim ................. H01L 23/24 257/676 |
| 2013/0049614 | A1 | 2/2013 | Kang et al. |
| 2013/0062745 | A1 * | 3/2013 | Kimura ................. H01L 23/4334 257/E23.116 |
| 2013/0105956 | A1 * | 5/2013 | Jo ................. H01L 23/49531 257/676 |
| 2013/0221507 | A1 | 8/2013 | Niu et al. |

FOREIGN PATENT DOCUMENTS

| | | |
|---|---|---|
| CN | 1220777 A | 6/1999 |
| CN | 1691327 A | 11/2005 |
| CN | 1697174 A | 11/2005 |
| CN | 201215804 Y | 4/2009 |
| CN | 101452902 A | 6/2009 |
| CN | 101515551 A | 8/2009 |
| CN | 101630644 A | 1/2010 |
| CN | 101720504 A | 6/2010 |
| CN | 101834176 A | 9/2010 |
| CN | 102569241 A | 7/2012 |
| CN | 101834176 B | 10/2012 |
| EP | 2 463 904 A2 | 6/2012 |
| EP | 2 477 220 A2 | 7/2012 |
| JP | S61-80842 A | 4/1986 |
| JP | 61-99360 A | 5/1986 |
| JP | 62-183547 A | 8/1987 |
| JP | 4-263459 A | 9/1992 |
| JP | H5-226548 A | 9/1993 |
| JP | 5-305362 A | 11/1993 |
| JP | H6-21308 A | 1/1994 |
| JP | 7-176670 A | 7/1995 |
| JP | 8-46126 A | 2/1996 |
| JP | H08-316270 | 11/1996 |
| JP | H11-330859 A | 11/1999 |
| JP | 2000-138343 A | 5/2000 |
| JP | 2000-236060 A | 8/2000 |
| JP | 2000-332189 A | 11/2000 |
| JP | 2001-24129 A | 1/2001 |
| JP | 2002-76234 A | 3/2002 |
| JP | 2006-202976 A | 8/2006 |
| JP | 2009-200338 A | 9/2009 |
| JP | 2009-302195 A | 12/2009 |
| KR | 10-1997-0077602 A | 12/1997 |
| KR | 20-1998-0032408 U | 9/1998 |
| KR | 10-1998-0073905 A | 11/1998 |
| KR | 10-1999-0035569 A | 5/1999 |
| KR | 10-1999-0050846 A | 7/1999 |
| KR | 10-0216989 B1 | 9/1999 |
| KR | 10-2004-0080275 | 9/2004 |
| KR | 10-2006-0045597 A | 5/2006 |
| KR | 10-2006-0127455 A | 12/2006 |
| KR | 10-2008-0094198 A | 10/2008 |
| KR | 10-2011-0080902 A | 7/2011 |
| KR | 10-2012-0089543 A | 8/2012 |

OTHER PUBLICATIONS

Korean Office Action issued on Nov. 30, 2018 in corresponding Korean Patent Application No. 10-2012-0141266 (10 pages in Korean).

Korean Office Action issued on Jul. 23, 2019 in corresponding Korean Patent Application No. 10-2012-0141266 (8 pages in Korean).

Chinese Office Action issued on Nov. 9, 2023, in counterpart Chinese Patent Application No. 202010573279.8 (12 pages in English, 15 pages in Chinese).

* cited by examiner

MULTICHIP PACKAGED SEMICONDUCTOR DEVICE

CROSS-REFERENCE TO RELATED APPLICATIONS

This application is a divisional application of U.S. patent application Ser. No. 13/875,676 filed on May 2, 2013, which claims the benefit under 35 U.S.C. § 119(a) of Korean Patent Application No. 10-2012-0141266 filed on Dec. 6, 2012, in the Korean Intellectual Property Office, the entire disclosures of which are incorporated herein by reference for all purposes.

BACKGROUND

1. Field

The following description relates to a multichip package and a fabricating method thereof, and to, for example, a multichip package provided in a form of a single package in which a plurality of semiconductor chips are arranged in a small outline package (SOP) as a surface mount device or in a quad flat package (QFP).

2. Description of Related Art

Semiconductor chip packaging technologies are actively being researched, with efforts to reduce the overall size of the devices, and to increase the packaging densities of the devices. Packaging technologies relate to appropriate arrangements of semiconductor elements such as ICs and switching elements in a smaller packages mounted onto a printed circuit board of a limited size, and with the arrangements that allow a greater number of packages to be mounted on the printed circuit board.

Active researches are taking place to develop a multichip package to mount a plurality of semiconductor devices on one package. The 'multichip package' refers to a structure with two or more semiconductor devices of different functions arranged on a lead frame pad as a single package.

An example of a package with a plurality of chips mounted thereon is a package constructed with a lead frame pad and two to four chips mounted thereon. The chips are connected to a lead frame and a bonding wire surrounding the periphery of the lead frame pad.

However, when a package is fabricated by simply arranging a plurality of semiconductor chips on a lead frame pad, thermal and/or electrical interference may occur among the neighboring chips within the package. Because the lead frame pad is made from a metallic material, without a separate structure to insulate or isolate the chips from each other, thermal and/or electrical interference is generated. Such thermal and/or electrical interferences may cause chips to malfunction, and may result in a defect in a product that is produced with such a package.

A structure to insulate or isolate the chips from each other may be provided to minimize the potential thermal and/or electric interferences. However, this complicates the manufacturing process as well as increase the size of the package.

Another suggestion is to fabricate each chip in the form of a package and mount several packages on a PCB. However, these individual packages of chips also have their shortcomings.

Because PCBs are used for the respective individual packages, the PCB size increases. Further, if individual packages are mounted on the PCBs, the need for lead frames increases soldering works that must be performed on the lead frames, compared to the packages with two to four chips mounted thereon. Additional works are also necessary to connect the PCBs with individual packages mounted thereon to each other.

Thus, the mounting of individual packages go against the purpose of packaging technologies that aim to improve performance by integrating as many devices as possible onto a PCB of a limited size.

As explained above, various multichip packaging technologies have been suggested, including packages having a plurality of chips designed and arranged on one lead frame pad, or mounting individual packages. However, the proposed package technologies exhibit their associated shortcomings, and the demand to design a multichip package that is compact and light-weight has not been satisfied. The associated shortcomings are themselves the reasons that hinder the designing of optimal multichip packages, and researches are taking place to resolve these issues. However, much improvement is necessary to design the optimal multichip package technology for certain package applications.

SUMMARY

In one general aspect, there is provided a multichip package, including: a plurality of semiconductor chips each mounted on corresponding lead frame pads; lead frames connected to the semiconductor chips by a bonding wire; and fixed frames integrally formed with at least one of the lead frame pads and configured to support the lead frame pads on a package-forming substrate.

The multichip package may be implementable on a small outline package (SOP) or a quad flat package (QFP).

The fixed frames may include a stepped portion formed on a connecting portion to the lead frame pads.

The semiconductor chips may include one control integrated circuit (IC) chip and a plurality of MOSFET chips.

In another general aspect, there is provided a multichip package for use in a small outline package (SOP), the multichip package including: a first lead frame pad; a second lead frame pad and a third lead frame pad arranged on two opposite sides the first lead frame pad; a first to third semiconductor chips attached onto the first to third lead frame pads; a lead frame connected to the first to third semiconductor chips by a bonding wire; and a fixed frames integrally formed with the first to third lead frame pads to support the first to third lead frame pads on a package-forming substrate.

The first semiconductor chip may be a control IC chip, and the second and third semiconductor chips may be MOSFET chips.

The fixed frames and the lead frame connected to the drains of the MOSEFT chips may include a stepped portion that is partially bent.

In another general aspect, there is provided a multichip package for use with a quad flat package (QFP), the multichip package including: a first lead frame pad; a second to fourth lead frame pads aligned on one side of the first lead frame pad; a first to fourth semiconductor chips bonded onto the first to fourth lead frame pads; a plurality of lead frames connected to the first to fourth semiconductor chips by a bonding wire; and a fixed frames integrally formed with the first to fourth lead frame pads to support the first to fourth lead frame pads so that the first to fourth lead frame pads are placed on a package-forming substrate.

The first semiconductor chip may be a control integrated circuit (IC) chip, and the second to fourth semiconductor chips may be MOSFET chips.

The fixed frames and the lead frame connected to drains of the MOSFET chips may include a stepped portion that is partially bent.

The lead frame connected to the control IC chip may be partially formed in a zigzag pattern.

The lead frames connected to the drains of the MOSFET chips each may have a greater width than each of the lead frames connected to sources of the MOSFET chips and each of the lead frame connected to the control IC chip.

An adhesive may be attached to an upper surface of each of the lead frames connected to the control IC chip, in an orthogonal relationship with respect to a lengthwise direction of the lead frames.

The adhesive may include a heat tape.

In yet another general aspect, there is provided a method of manufacturing a multichip package, involving: mounting a first chip on a first lead frame pad; mounting a second chip on a second lead frame pad; positioning the first and second lead frame pads on a package-forming substrate by integrating portions of the lead frame pads with fixed frames; and forming a mold over the first and second chips and the first and second lead frame pads.

The general aspect of the method may further involve: wiring the first and second chips to lead frames such that the first and second chips are positioned in a center portion of the package-forming substrate, the lead frames extending radially outward from the center portion, and a number of the chips being the same as a number of the lead frame pads.

The mountings of the first and second chips on the first and second lead frame pads may involve bonding the first and second chips to the corresponding lead frame pads with Ag epoxy.

The first chip may be a control IC chip, and the second chip may be a MOSFET chip.

The lead frames connected to a drain of the MOSFET chip each may have a greater width than the lead frames connected to a source of the MOSFET chip, and the fixed frames may have a stepped portion so that the lead frame pads are positioned lower than the fixed frames.

Other features and aspects may be apparent from the following detailed description, the drawings, and the claims.

Figure 1:
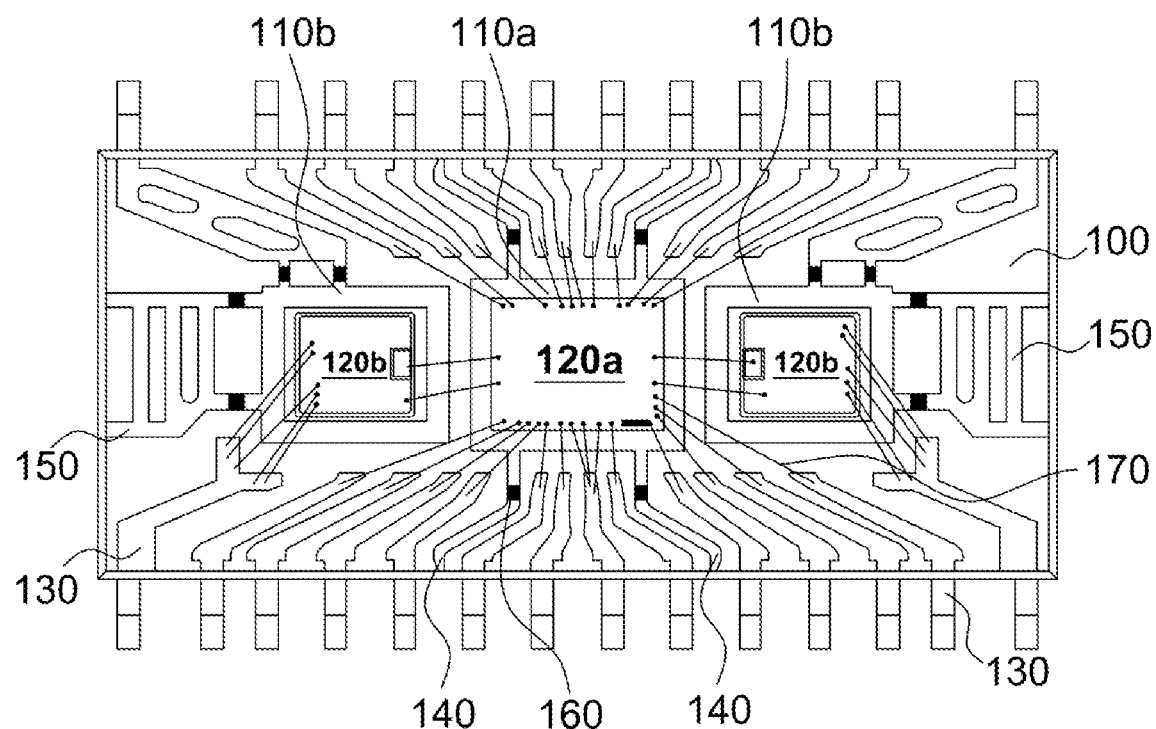
FIG. 1 is a plan view of an example of a small outline package.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

In an example, a multichip package may be constructed by adding a plurality of chips to a small outline package (SOP) and a quad flat package (QFP) provided on a surface of a printed circuit board (PCB) by using a surface mount technology (SMT). For instance, three SOP chips and four QFP chips may be arranged to construct a multichip package.

The 'QFP' as used herein refers to a package structure in which lead frames protrudes from the four corners. The 'SOP' as used herein refers to a package structure in which lead frame protrudes from both sides of the package. The SOP has a lead frame that is shorter in length than that of the other packages, including QFP, to reduce occupying area on the PCB and also to speed up the signal transmission.

Generally, the QFP and SOP are designed such that a maximum of two chips are mounted on the package. To ensure that the product mounted on the package performs under an optimum condition, the use of a plurality of packages is necessary. Accordingly, the occupying area on the PCB increases. Accordingly, it is necessary to mount more chips on one QFP and SOP.

Various examples of multichip packages and methods for manufacturing the same are described below. For example, a control integrated circuit (IC) chip and two MOSFET chips may be arranged on a small outline package (SOP) used as a surface mount device. In another example, a control IC chip and three MOSFET chips may be arranged on a quad flat package (QFP). The control IC chip and the MOSFET chips may be mounted not on a single lead frame pad, but on corresponding lead frame pads. Lead frames connected to the lead frame pads with the chips mounted thereon and fixed frames may include a stepped portion so that the lead frame pads are placed lower than the fixed frames. In such examples, the occupying area on the PCB by the package mounted thereon may be reduced, and the occurrence of thermal and/or electrical interference among chips may be minimized due to the use of individual lead frame pads for each semiconductor chips. Further, the ingress of external moisture into molded package may be blocked or reduced due to the presence of the stepped portion.

The structures of the SOP and QFP will be explained in a greater detail below with reference to a first example and a second example, respectively.

The first example will be explained below with reference to FIGS. 1 to 3.

Figure 2:
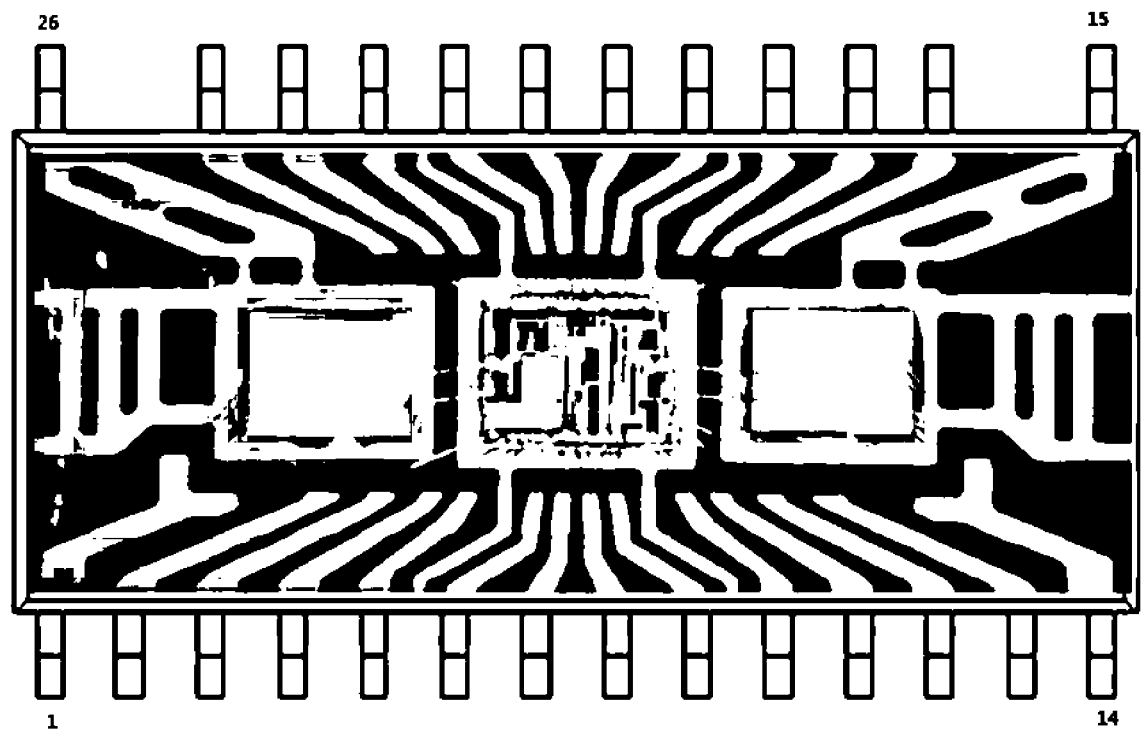
FIG. 2 is a photograph of an example of an actually implemented package having features of the small outline package illustrated in FIG. 1.
Figure 3:
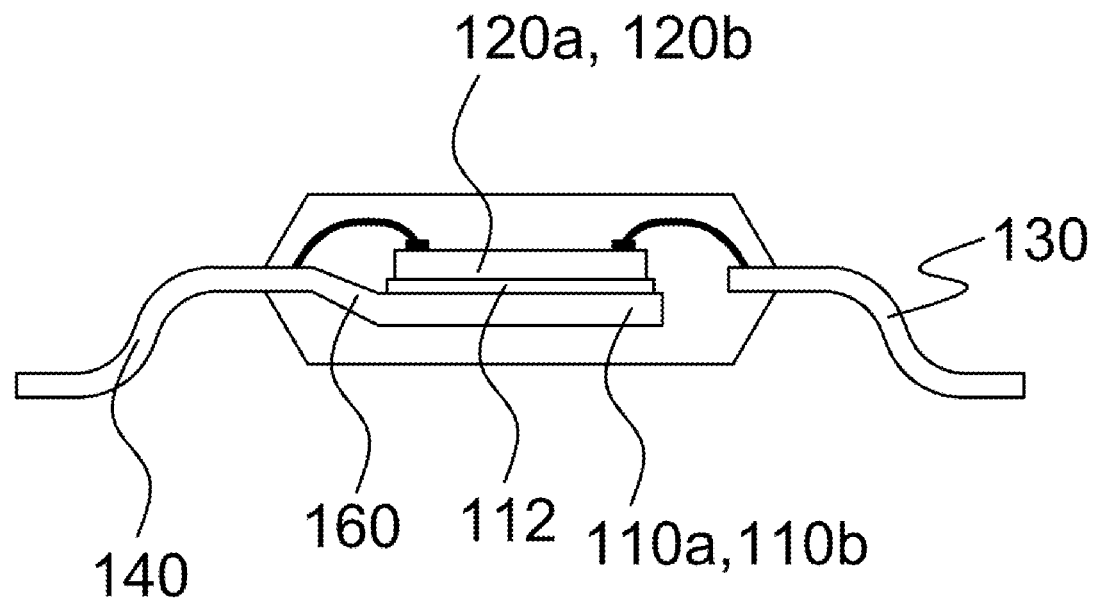
FIG. 3 is a schematic side view of the package illustrated in FIG. 2.

FIG. 1 is a plan view of a small outline package according to a first example, and FIG. 2 is a photograph of the actually designed package of FIG. 1.

Referring to FIGS. 1 and 2, lead frame pads 110*a*, 110*b* are formed on a package-forming substrate 100. The lead frame pads 110*a*, 110*b* may be provided to correspond in number to the chips to be mounted on the package. In this example, a total of three chips 102*a*, 102*b* may be provided. However, different number of chips may be provided in other examples. For instance, three or more chips may be mounted on a package. In this example, three lead frame pads 110*a*, 110*b* may be accordingly provided. One lead frame pad 110*a* may be placed in the center of the package-forming substrate 100, sided by two other lead frame pads 110*b* that are placed on the left and right sides symmetrically with respect to the lead frame pad 110*a*. The lead frame pads 110a, 110b may be provided in the same shape as the chip, in a slightly larger size than the chips, to thus ensure that the chips are mounted stably on the lead frame pads 110a, 110b. The respective lead frame pads 110a, 110b may be uniform in size or be different in sizes. If the chips have different sizes, the size of the lead frame pads on which the chips are mounted may also vary.

As explained above, because the lead frame pads 110a, 110b are individually employed according to the number of chips, compared to an example in which a plurality of chips are mounted on a single lead frame pad, the occurrence of a thermal and/or electrical interference among the chips can be reduced or prevented.

A control IC chip 120a and MOSFET chips 120b may be mounted on each lead frame pad 110a, 110b as switching elements. The control IC chip 120a may be mounted on the lead frame pad 110a at the center, while the MOSFET chips 120b may be mounted on the lead frame pads 110b on the left and right sides of the control IC chip 120a. 'MAP3321' chip may be used as a control IC chip 120a. If implemented in a LCD, the chip may play a role of controlling the backlighting function of a LED driver which controls a LED as a source of backlight. Of course, chips and function of the chips may vary depending on products. The control IC chip 120a and the MOSFET chips 120b may be bonded by Ag epoxy 112, the conductive adhesive applied on the lead frame pads 110a, 110b, as illustrated in FIG. 3. FIG. 3 illustrates an example in which the lead frame pads 110a, 110b and the control IC/MOSFET chips 120a, 120b are molded by a mold compound.

The lead frame 130 may be formed so as to radially extend from the control IC chip 120a and the MOSFET chips 120b that are positioned at a center of the package. When the package is mounted on a PCB (not illustrated), the lead frame 130 operates to connect the control IC/MOSFET chips 120a, 120b to the circuit on the PCB. The lead frame 130 may be made from a conductive material such as copper (Cu).

The lead frame pads 110a, 110b have to be fixed on an upper portion of a lower surface of the package-forming substrate 100. To this end, fixed frames 140, 150 may be used. The fixed frames 140, 150 may be integrated with the lead frame pads 110a, 110b, or substantially be extended from the lead frame pads 110a, 110b. In addition to the fixed frames 140, 150, a part of the lead frame 130 may be used to support the lead frame pads 110a, 110b. Referring to the lead frame pad 110b with the MOSFET chips 120b mounted thereon, a specific part of the lead frame pad 110b that is connected to a drain to release heat from the driving of the MOSFET chips 120b may be the one. The lead frame may also be considered to be extended from the lead frame pad 110b. The lead frame may be pin numbers 15 and 26, for example, as illustrated in FIG. 2.

Meanwhile, a stepped portion 160 that is partially bent may be formed on the lead frame (i.e., pin numbers 15, 26) and the fixed frames 140, 150. The stepped portion 160 plays a role of positioning the lead frame pads 110a, 110b at a lower location than the lead frame 130. This is done to block possible ingress of moisture from an outside of the package. The structure is shown in FIG. 3 that is a side view of FIG. 1. FIG. 3 illustrates the lead frame pads 110a, 110b at a lower position than the lead frame 130 due to the presence of the stepped portion 160.

The control IC/MOSFET chips 120a, 120b may be connected to the lead frame 130 by a bonding wire 170. The bonding wire 170 may be a generally-used copper (Cu) wire coated with lead (Pb).

Referring to the first example, one control IC chip 120a and two MOSFET chips 120b on the left and right sides of the control IC chip 120a are arranged on the SOP. Such design of the package will have to meet the requirements of a manufacturer of the products using the package.

Meanwhile, the functions of the pin numbers assigned to the SOP fabricated according to the first example is tabulated as follows. It is noted that this arrangement of the pin numbers is provided as an example only, and different arrangements of pin numbers are within the contemplation of those skilled in the art.

TABLE 1

| PIN NO | | Description | PIN NO | | Description |
|---|---|---|---|---|---|
| 1 | SOU1 | Ch1 internal Dim MOSFET Source | 2 | LUVP | Line under voltage protection |
| 3 | NCS | Negative current senser for LED String Failure protection | 4 | COMP1 | Ch1 Error Amp. Compensation |
| 5 | COMP2 | Ch2 Error Amp. Compensation | 6 | PWM1 | Ch1 PWM Dimming Input |
| 7 | PWM2 | Ch2 PWM Dimming Input | 8 | VCC | Input Power Supply |
| 9 | SGND | Signal GND | 10 | FBP | Error Amp. Non-inverting Input/Positive Current Sense |
| 11 | REF | Reference voltage | 12 | OD1 | First over duty reference |
| 13 | OD2 | Second over duty reference | 14 | SOU2 | Ch2 internal Dim MOSFET Source |
| 15 | DRN2 | Ch2 internal Dim MOSFET Drain | 16 | OVP2 | Ch2 Over Voltage Protection |
| 17 | SEL | Selection for OD1 or OD2 | 18 | MODE | 3D mode input |
| 19 | CS2 | Ch2 current sense of the Boost Convert | 20 | GATE2 | Ch2 Gate drive Output for Boost Convert |
| 21 | PGND | Power Ground | 22 | GATE1 | Ch1 Gate drive Output for Boost Convert |
| 23 | CS1 | Ch1 current sense of the Boost Convert | 24 | FLT | LED sting failure protection output for power supply |
| 25 | OVP1 | Ch1 Over Voltage Protection | 26 | DRN1 | Ch1 internal Dim MOSFET Drain |

A second example will be explained below with reference to FIGS. 4 and 5.

Figure 4:
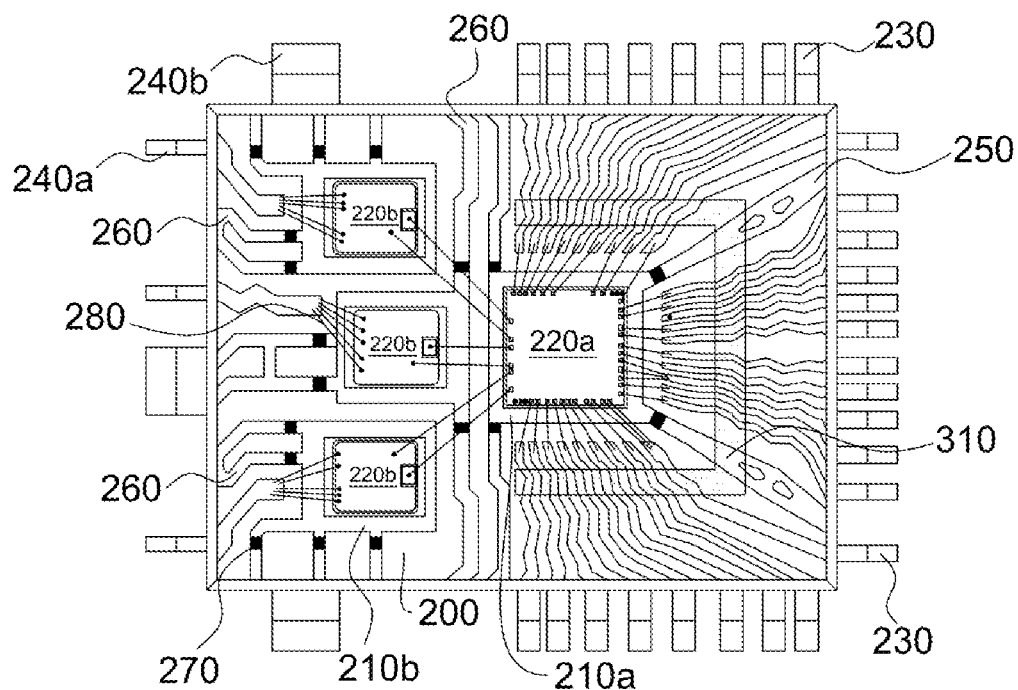
FIG. 4 is a plan view of an example of a quad flat package.

FIG. 4 is a plan view of a QFP according to the second example.

Referring to FIG. 4, one lead frame pad 210a for a control IC chip and three lead frame pads 210b for MOSFET chips are constructed on a package-forming substrate 200. The lead frame pad 210a for the placement of a control IC chip may be placed on a right side, while the lead frame pad 210b for the placement of three MOSFET chips may be placed on a left side in parallel. In this example, the shape and size of the lead frame pads 210a, 210b may be identical to those of the chips of the first example explained above, and the lead frame pads 210a, 210b may be provided in a slightly larger size than the chips.

One control IC chip 220a and three MOSFET chips 220b as switching elements may be mounted on each lead frame pad 210a, 210b. The control IC chip 220a may be mounted on the lead frame pad 210a on the right side, while the MOSFET chips 220b may be mounted on the lead frame pads 210b on the left side. 'MAP3331' chip may be used as the control IC chip 120a. Chips and functions of the chips may vary depending on products. For example, if implemented in a LCD, the IC chip 120a may play a role of controlling the backlighting function of a LED driver that controls an LED as a source of backlight. The control IC chip 220a and the MOSFET chips 220b may be bonded by Ag epoxy 112 to the lead frame pads 210a, 210b, which is the same as the conductive adhesive applied on the lead frame pads 110a, 110b in the example illustrated in FIG. 3.

As explained above, because the lead frame pads 210a, 210b are individually employed according to the number of the control IC/MOSFET chips 220a, 220b, compared to an example in which a plurality of chips are mounted on one single lead frame pad, the occurrence of thermal and/or electrical interference among the chips can be reduced or prevented.

The lead frames 230, 240a, 240b may be constructed to transmit signals from the one control IC chip 220a and the MOSFET chips 220b to the PCB (not illustrated). The lead frame 230 may be used for the control IC chip 220a, and the lead frames 240a, 240b may be used for the MOSFET chips 220b. According to the illustrated example, a total of 34 lead frames 230, 240a, 240b may be provided to provide the functions that will be explained below (Table 2). The lead frames 230, 240a, 240b may be made from a conductive material such as copper (Cu).

The lead frame pads 210a, 210b may be fixed to an upper portion of a lower surface of the package-forming substrate 200. To this end, the lead frame pad 210a on which the control IC chip 220a is mounted, may be integrally formed with the fixed frame 250. The lead frame pad 210b on which the MOSFET chips 220b are mounted, may be supported by the fixed frame 260 extended from the lead frame pad 210b and the lead frame 240b connected to the drain. When the MOSFET chips 220b are driven, the lead frame 240b may release the generated heats and also support the lead frame pad 210b. Also, compared to the other lead frames 230, 240a, the lead frame 240b may have relatively wider width. This is to facilitate the release of the heat generated at the drains of the MOSFET chips 220b to outside. The heat release efficiency substantially increases as the width of the lead frame increases.

The lead frame 240b and the fixed frames 250, 260 may include a partially-bent stepped portion 270. In FIG. 4, some of the stepped portions are referenced by a reference numeral. The presence of the stepped portion 270 causes the lead frame pads 210a, 210b with the control IC/MOSFET chips 220a, 220b to be placed at a lower position than the lead frames 230, 240 and the fixed frames 250, 260. This is done so to minimize the absorption of external moisture. Because the structure is identical to that of the first example illustrated in FIG. 3, no further explanation will be provided for the sake of brevity.

The control IC/MOSFET chips 220a, 220b and the lead frames 230, 240a may be connected by a bonding wire 280. The bonding wire 280 may be a generally-used copper (Cu) wire coated with lead (Pb).

Figure 5:
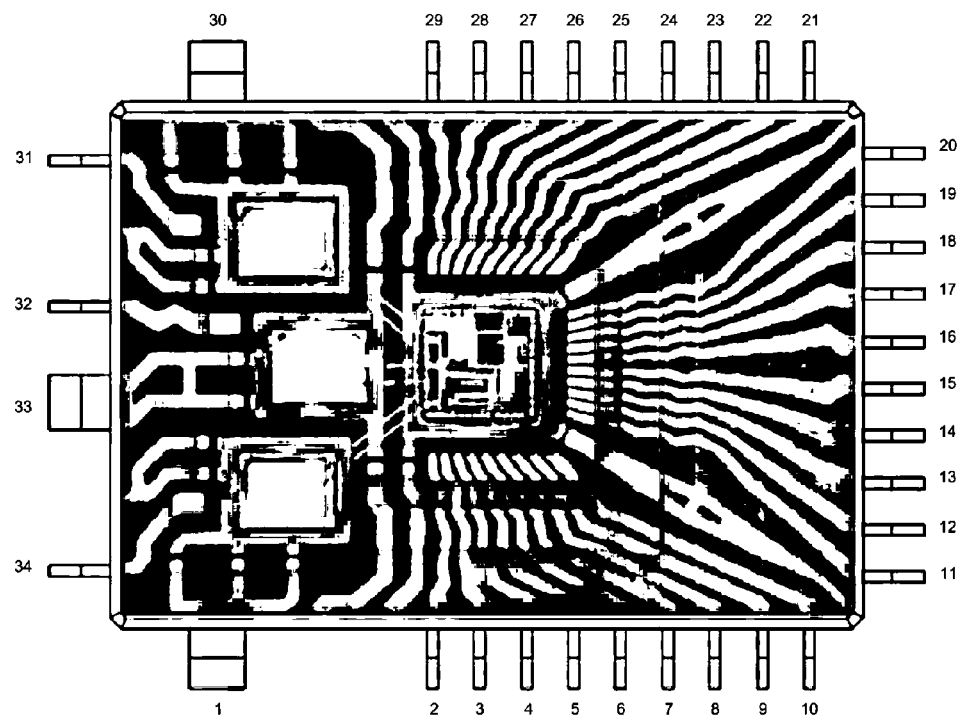
FIG. 5 is a photograph of an example of an actually implemented quad flat package taken before the molding of the package.

The lead frame 230 connected to the control IC chip 220a may be formed such that a part of the lead frame 230 may be formed into a zigzag pattern, as illustrated in FIGS. 4 and 5. The lead frame 230 may be partially formed in a zigzag pattern to minimize potential delamination of the lead frame 230 due to possible absorption of external moisture.

A heat tape 310 may also be attached on the lead frame 230 to fix the lead frame 230 and also to prevent bending of the lead frame 230. The heat tape 310 may have a predetermined width and formed in an orthogonal relationship with respect to the lengthwise direction of the lead frame 230. Of course, an adhesive member other than the heat tape 310 may be provided to affix the lead frame 230 in a state of being placed on the upper surface of the lead frame 230.

As explained above, according to the second example, one control IC chip 220a sided by three MOSFET chips are arranged and designed on the QFP.

When designing a QFP, such design of the package will have to meet the requirements of a manufacturer of the product that uses the packages. The requirements may include, for example, the use of at least 28 lead frames 230, 240a, 240b, the control IC chip 220a and the lead frame 230 at an interval of at least 1.25 mm, and the MOSFET chips 220b and the lead frames 240a, 240b at an interval of at least 1.6 mm.

For illustrative purposes, the functions of the pin numbers assigned to a SOP fabricated according to the second example is tabulated as follows. For the pin numbers, reference is made to FIG. 5 that includes a photograph taken before molding a designed quad flat package having the features illustrated in FIG. 4.

TABLE 2

| PIN NO | Description | PIN NO | Description |
| --- | --- | --- | --- |
| 1 DRN1 | Ch1 internal Dim MOSFET Drain | 2 FBP | Error Amp. Non-inverting Input/Positive Current Sense |
| 3 REF | Reference voltage | 4 OD1 | First over duty reference |
| 5 OD2 | Second over duty reference | 6 COMP1 | Ch1 Error Amp. Compensation |
| 7 COMP2 | Ch2 Error Amp. Compensation | 8 COMP3 | Ch3 Error Amp. Compensation |
| 9 SGND | Signal GND | 10 VCC | nput Power Supply |
| 11 GATE1 | Ch1 Gate drive Output for Boost Convert | 12 CS1 | Ch1 current sense of the Boost Convert |

TABLE 2-continued

| PIN NO | Description | PIN NO | Description |
| --- | --- | --- | --- |
| 13 PGND | Power Ground | 14 CS2 | Ch2 current sense of the Boost Convert |
| 15 GATE2 | Ch2 Gate drive Output for Boost Convert | 16 CS3 | Ch3 current sense of the Boost Convert |
| 17 GATE3 | Ch3 Gate drive Output for Boost Convert | 18 NC | No Connection |
| 19 LUVP | Line under voltage protection | 20 NCS | Negative current senser for LED String Failure protection |
| 21 FLT | LED sting failure protection output for power supply | 22 PWM1 | Ch1 PWM Dimming Input |
| 23 PWM2 | Ch2 PWM Dimming Input | 24 PWM3 | Ch3 PWM Dimming Input |
| 25 SEL | Selection for OD1 or OD2 | 26 MODE | 3D mode input |
| 27 OVP1 | Ch1 Over Voltage Protection | 28 OVP2 | Ch2 Over Voltage Protection |
| 29 OVP3 | Ch3 Over Voltage Protection | 30 DRN3 | Ch3 internal Dim MOSFET Drain |
| 31 SOU3 | Ch3 internal Dim MOSFET Source | 32 SOU2 | Ch2 internal Dim MOSFET Source |
| 33 DRN2 | Ch2 internal Dim MOSFET Drain | 34 SOU1 | Ch1 internal Dim MOSFET Source |

According to various examples explained above, one control IC chip and two MOSFET chips may be arranged on a SOP as a surface mount device, or one control IC chip and three MOSFET chips may be arranged on a QFP, so that occupying area on the PCB may be minimized. Further, because the respective chips are mounted on the respectively corresponding lead frame pads, the occurrence of any thermal and/or electrical interference among the chips may be prevented or reduced.

According to some of the examples described above, a multichip package with more semiconductor chips integrated thereon by using an improved chip arrangement in comparison to chip arrangements used in other quad flat packages or small outline packages may be obtained.

In another example, a multichip package is provided, which may include a plurality of lead frame pads, a semiconductor chips respectively mounted on the lead frame pads, a lead frame connected to the semiconductor chips by a bonding wire, and a fixed frames integrally formed with the respective lead frame pads, to support the lead frame pads to be placed on an upper portion of a lower surface of a package-forming substrate. The multichip package may be implemented on a small outline package (SOP) or a quad flat package (QFP), and the fixed frames may include a stepped portion formed on a connecting portion to the lead frame pads. The semiconductor chips may include a control integrated circuit (IC) chip and a plurality of MOSFET chips.

In another example, a multichip package for use in a small outline package (SOP) is provided, which may include a first lead frame pad, a second lead frame pad and a third lead frame pad arranged symmetrically on a right side and a left side to the first lead frame pad, a first to third semiconductor chips attached onto the first to third lead frame pads, a lead frame connected to the first to third semiconductor chips by a bonding wire, and a fixed frames integrally formed with the first to third lead frame pads to support the first to third lead frame pads to be placed on an upper portion of a lower surface of a package-forming substrate. The first semiconductor chip may be a control IC chip and the second and third semiconductor chips may be MOSFET chips. The fixed frames and the lead frame connected to and the drains of the MOSEFT chips may include a stepped portion which is partially bent.

In another example, a multichip package for use in a quad flat package (QFP) is provided, which may include a first lead frame pad, a second to fourth lead frame pads arranged parallel on one side of the first lead frame pad, a first to fourth semiconductor chips bonded onto the first to fourth lead frame pads, a plurality of lead frames connected to the first to fourth semiconductor chips by a bonding wire, and a fixed frames integrally formed with the first to fourth lead frame pads to support the first to fourth lead frame pads so that the first to fourth lead frame pads are placed on an upper portion of a lower surface of a package-forming substrate. The first semiconductor chip may be a control integrated circuit (IC) chip, and the second to fourth semiconductor chips may be MOSFET chips. The fixed frames and the lead frame connected to drains of the MOSFET chips may include a stepped portion which is partially bent. The lead frame connected to the control IC chip may be partially formed in a zigzag pattern. An adhesive may be attached to an upper surface of each of the lead frames connected to the control IC chip, in an orthogonal relationship with respect to a lengthwise direction of the lead frames, and the adhesive may include a heat tape.

According to some of the examples described herein, because the lead frame pads having mounted thereon chips are independently provided to every package, the occurrence of thermal and/or electrical interferences among the chips may be minimized.

In other examples, by improving the chip arrangement of a multichip package such as a quad flat package (QFP) and a small outline package (SOP), one control IC chip and three MOSFET chips may be mounted on a QFP, or one control IC chip and two MOSFET chips may be mounted on a SOP. As a result, occupying area on the PCB may be reduced, and the cost of manufacturing process may be also reduced.

In other examples, because the lead frames connected to drains of the MOSFET chips each has a greater width than those of the other lead frames in a QFP, the heat generated from the MOSFET chips can be released to outside easily. Accordingly, no separate heat sink is necessary for the heat release, and a simplified package structure can be provided.

In other examples, because a part of the lead frame connected to the control IC chip is formed in a zigzag pattern, the possibility of delamination due to moisture ingress from outside may be reduced or prevented. Also, a heat adhesive tape may be attached onto the lead frames to prevent its bending due to the long length of the lead frame.

While various examples described above provide a chip arrangement of a total of three or four chips on a SOP and QFP, more than three chips may be mounted on the respective lead frame pads. The number of the lead frame pads may correspond to the number of the chips. For example, more than 3 chips and less than 10 chips may be mounted on a SOP or a QFP, and the lead fames may be arranged so as to radially extend from the chips. The features of the present disclosure may thus be embodied in various different forms and should not be construed as being limited to the examples set forth herein. Rather, the examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multichip package, comprising:
   semiconductor chips, mounted in a linearly extending row, each mounted on an individually corresponding lead frame pad;
   each individually corresponding lead frame pad integrally formed with and supported by a corresponding fixed frame, comprising a connection portion extending from an end and coupled to the corresponding fixed frame, and elevated relative to another end; and
   a corresponding lead frame spaced apart from the individually corresponding lead frame pad,
   wherein the connection portion comprises a first stepped portion extending to position the individually corresponding lead frame pad lower than the corresponding lead frame;
   wherein the corresponding lead frame comprises a second stepped portion extending to position opposing ends of the corresponding lead frame on different planes; and
   wherein a lower surface contour of each of the semiconductor chips and an upper surface contour of the individually corresponding lead frame pad are similar.

2. The multichip package of claim 1, wherein the multichip package is implementable on a small outline package (SOP).

3. The multichip package of claim 1, wherein the corresponding fixed frame comprises the first stepped portion formed on the connection portion connected to the individually corresponding lead frame pad.

4. The multichip package of claim 1, wherein the semiconductor chips comprise a control integrated circuit (IC) chip and MOSFET chips.

5. The multichip package of claim 1, wherein each of fixed frames has no pin protruding from a package-forming substrate and each of lead frames has a pin protruding from the package-forming substrate.

6. The multichip package of claim 1, further comprising lead frames configured to transmit signals from the semiconductor chips,
   wherein a lead frame connected to a drain comprises the second stepped portion.

7. The multichip package of claim 1, wherein one of the semiconductor chips is mounted at a center of the multichip package.

8. A multichip package for use in a small outline package (SOP), the multichip package comprising:
   a first lead frame pad;
   a second lead frame pad and a third lead frame pad arranged on both sides of the first lead frame pad;
   first to third semiconductor chips attached to the first to third lead frame pads, respectively;
   a corresponding lead frame spaced apart from each of the first to third lead frame pads and connected to each of the first to third semiconductor chips by a bonding wire; and
   a corresponding fixed frame integrally formed with each of the first to third lead frame pads to support the first to third lead frame pads on a package-forming substrate,
   wherein each of fixed frames comprises a first stepped portion extending to position each of the first to third lead frame pads lower than the corresponding lead frame.

9. The multichip package of claim 8, wherein the first semiconductor chip is a control IC chip, and the second and third semiconductor chips are MOSFET chips.

10. The multichip package of claim 9, wherein the corresponding lead frame connected to drains of the MOSFET chips comprises a second stepped portion that is partially bent.

* * * * *